(12) United States Patent
Ogawa et al.

(10) Patent No.: US 10,037,928 B2
(45) Date of Patent: Jul. 31, 2018

(54) CIRCUIT BOARD AND ELECTRONIC DEVICE

(71) Applicant: KYOCERA Corporation, Kyoto-shi, Kyoto (JP)

(72) Inventors: Narutoshi Ogawa, Kirishima (JP); Kensou Ochiai, Kawasaki (JP); Noritaka Niino, Kirishima (JP); Shinichi Kooriyama, Kirishima (JP); Masashi Konagai, Kirishima (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 15/537,684

(22) PCT Filed: Jan. 23, 2016

(86) PCT No.: PCT/JP2016/051944
§ 371 (c)(1),
(2) Date: Jun. 19, 2017

(87) PCT Pub. No.: WO2016/121660
PCT Pub. Date: Aug. 4, 2016

(65) Prior Publication Data
US 2018/0005914 A1    Jan. 4, 2018

(30) Foreign Application Priority Data
Jan. 29, 2015 (JP) .................................. 2015-015639

(51) Int. Cl.
*H05K 7/20* (2006.01)
*H01L 23/367* (2006.01)
(Continued)

(52) U.S. Cl.
CPC .......... *H01L 23/367* (2013.01); *H01L 23/142* (2013.01); *H01L 23/3735* (2013.01); *H01L 23/49833* (2013.01); *H05K 7/209* (2013.01)

(58) Field of Classification Search
CPC . G06F 1/181–1/182; H05K 7/20218–7/20381;
(Continued)

(56) References Cited

U.S. PATENT DOCUMENTS 4,542,784 A * 9/1985 Welsh .................. H05K 7/1404
165/170
4,770,953 A * 9/1988 Horiguchi ........... C04B 41/5053
174/16.3
(Continued)

FOREIGN PATENT DOCUMENTS

| JP | 2003-086747 A | 3/2003 |
|----|---------------|--------|
| JP | 2009-044152 A | 2/2009 |
| JP | 2013-243181   | 12/2013 |

OTHER PUBLICATIONS

International Search Report, PCT/JP2016/051944, dated Apr. 5, 2016, 2 pgs.

*Primary Examiner* — Anthony Haughton
*Assistant Examiner* — Razmeen Gafur
(74) *Attorney, Agent, or Firm* — Volpe and Koenig, P.C.

(57) ABSTRACT

A circuit board includes a metal circuit plate, a metallic heat diffusing plate disposed below the metal circuit plate and having an upper surface and a lower surface, a metallic heat dissipating plate below the heat diffusing plate, an insulating substrate disposed between the metal circuit plate and the heat diffusing plate, and an insulating substrate disposed between the heat diffusing plate and the heat dissipating plate. A grain diameter of metal grains contained in the heat diffusing plate decreases from each of the upper surface and
(Continued)

the lower surface of the heat diffusing plate toward a center portion of the heat diffusing plate in a thickness direction.

20 Claims, 9 Drawing Sheets

(51) Int. Cl.
*H01L 23/373* (2006.01)
*H01L 23/498* (2006.01)
*H01L 23/14* (2006.01)
*H01L 23/473* (2006.01)

(58) Field of Classification Search
CPC ............... H05K 7/20409–7/20418; H05K 7/20009–7/202; H01L 23/367–23/3677; H01L 23/473; H01L 23/46–23/467
USPC ...... 361/676–678, 679.46–679.54, 688–723, 361/709–710, 719–721, 699–704; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | | |
|---|---|---|---|---|
| 5,214,563 A * | 5/1993 | Estes | ............... | H05K 3/3426 165/185 |
| 5,388,635 A * | 2/1995 | Gruber | ............... | F28F 3/12 165/185 |
| 5,506,754 A * | 4/1996 | Brooks | ............... | H05K 1/141 361/719 |
| 5,514,327 A * | 5/1996 | Schneider | ............... | B22F 5/00 257/E23.102 |
| 5,521,140 A * | 5/1996 | Matsuda | ............... | B41J 2/005 347/171 |
| 5,597,643 A * | 1/1997 | Weber | ............... | H01L 21/4857 174/255 |
| 5,869,890 A * | 2/1999 | Nishiura | ............... | H01L 21/4807 257/705 |
| 6,180,891 B1 * | 1/2001 | Murdeshwar | ............... | B23K 20/005 174/260 |
| 6,585,039 B2 * | 7/2003 | Sagal | ............... | B29C 45/14622 165/104.26 |
| 6,864,567 B2 * | 3/2005 | Yu | ............... | H01L 33/62 257/675 |
| 6,947,285 B2 * | 9/2005 | Chen | ............... | H01L 23/3737 257/706 |
| 7,099,157 B2 * | 8/2006 | Boer | ............... | H05K 7/20463 165/185 |
| 7,523,617 B2 * | 4/2009 | Venkatasubramanian | ............... | F25B 21/02 165/104.33 |
| 7,535,715 B2 * | 5/2009 | Chung | ............... | F28F 13/00 361/704 |
| 7,576,988 B2 * | 8/2009 | Schwarz | ............... | H05K 7/20454 361/704 |
| 7,649,739 B2 * | 1/2010 | Murai | ............... | H05K 1/0206 361/679.47 |
| 7,915,533 B2 * | 3/2011 | Kaga | ............... | C04B 35/584 174/137 B |
| 7,918,021 B2 * | 4/2011 | Kogure | ............... | H05K 3/0055 29/825 |
| 7,948,075 B2 * | 5/2011 | Kaga | ............... | C04B 35/5935 174/137 B |
| 7,998,367 B2 * | 8/2011 | Khraishi | ............... | C09K 5/06 252/500 |
| 8,129,034 B2 * | 3/2012 | Palumbo | ............... | A01K 87/00 428/457 |
| 8,497,449 B1 * | 7/2013 | Budd | ............... | B23K 26/06 219/121.69 |
| 8,563,869 B2 * | 10/2013 | Kaga | ............... | H01L 23/15 174/252 |
| 8,841,559 B2 * | 9/2014 | Chiba | ............... | B21J 15/02 174/255 |
| 2003/0044653 A1 * | 3/2003 | Hiramatsu | ............... | B32B 18/00 428/704 |
| 2004/0119978 A1 * | 6/2004 | Borden | ............... | G01N 21/1717 356/432 |
| 2006/0081844 A1 * | 4/2006 | Hirosue | ............... | H01L 27/12 257/59 |
| 2009/0039498 A1 | 2/2009 | Bayerer | | |
| 2010/0065962 A1 | 3/2010 | Bayerer et al. | | |
| 2015/0140740 A1 * | 5/2015 | Moldovan | ............... | C25D 1/04 438/122 |

* cited by examiner

CIRCUIT BOARD AND ELECTRONIC DEVICE

TECHNICAL FIELD

The present invention relates to a circuit board and an electronic device using the circuit board.

BACKGROUND ART

In a conventional circuit board used as a circuit board for a large current, a metal circuit plate shaped like a circuit pattern to receive a large current, insulating substrates made of a ceramic material, a metallic heat diffusing plate used as a means for spreading heat from an electronic component, such as a power module, mounted on the metal circuit plate in the lateral direction, and a metallic heat dissipating plate used for heat dissipation are stacked in this order and are bonded together with a brazing material (see, for example, PTL 1).

CITATION LIST

Patent Literature

PTL 1: Japanese Unexamined Patent Application Publication No. 2003-86747

SUMMARY OF INVENTION

Technical Problem

The above-described circuit board is required to further increase the thickness of the heat diffusing plate in order to improve thermal conductivity between the insulating substrates. However, if the thickness of the heat diffusing plate is merely increased, stress is applied to the insulating substrates when the heat diffusing plate is expanded and contracted by thermal history, and this increases the risk of fracture of the insulating substrates.

For example, when the heat diffusing plate contracts, since interfaces between the insulating substrates and the heat diffusing plate are bonded together, the insulating substrates are pulled by deformation of the heat diffusing plate due to contraction. The insulating substrates thus pulled may warp toward a center portion of the heat diffusing plate in the thickness direction. It is required to suppress fracture of the insulating substrates due to such a warp of the insulating substrates.

Solution to Problem

A circuit board according to an aspect of the present invention includes a metal circuit plate, a metallic heat diffusing plate below the metal circuit plate, a metallic heat dissipating plate below the heat diffusing plate, a first insulating substrate disposed between the metal circuit plate and the heat diffusing plate and having an upper surface bonded to a lower surface of the metal circuit plate and a lower surface bonded to an upper surface of the heat diffusing plate, and a second insulating substrate disposed between the heat diffusing plate and the heat dissipating plate and having an upper surface bonded to a lower surface of the heat diffusing plate and a lower surface bonded to an upper surface of the heat dissipating plate. A grain diameter of metal grains contained in the heat diffusing plate decreases from each of the upper surface and the lower surface of the heat diffusing plate toward a center portion of the heat diffusing plate in a thickness direction.

An electronic device according to an aspect of the present invention includes the above-described circuit board and an electronic component mounted on the metal circuit plate in the circuit board.

Advantageous Effects of Invention

According to the circuit board of the aspect of the present invention, the grain diameter of the metal grains contained in the heat diffusing plate is relatively larger in a region at a short distance from the upper surface of the heat diffusing plate and a region at a short distance from the lower surface of the heat diffusing plate than in a region between these regions. For this reason, the heat diffusing plate relatively easily deforms in the above-described regions, and this deformation can relax stress generated by a thermal expansion mismatch between the insulating substrates and the heat diffusing plate.

The grain diameter of the metal grains is relatively smaller in a region at a long distance from the upper surface of the heat diffusing plate in a part of the heat diffusing plate on an upper side of the center portion in the thickness direction and a region at a long distance from the lower surface of the heat diffusing plate in a part of the heat diffusing plate on a lower side of the center portion of the heat diffusing plate in the thickness direction than in regions at a short distance from the upper surfaces and the lower surfaces of the insulating substrates. In the regions where the grain diameter of the metal grains is relatively small, rigidity of the heat diffusing plate is relatively high. Thus, the heat diffusing plate rarely deforms as a whole.

Therefore, a warp of the heat diffusing plate caused when the heat diffusion plate is expanded and contracted by thermal history can be suppressed. Since the warp of the heat diffusing plate is suppressed, warps of the insulating substrates and the entire circuit board are also suppressed, and this can reduce stress to the insulating substrates due to deformation. As a result, it is possible to provide a circuit board that is advantageous in reliability while ensuring desired heat dissipation.

According to the electronic device of the aspect of the present invention, since the electronic device includes the above-described circuit board, heat generated from the electronic component can be effectively dissipated, and a highly reliable device can be achieved.

DESCRIPTION OF EMBODIMENTS

Figure 1:
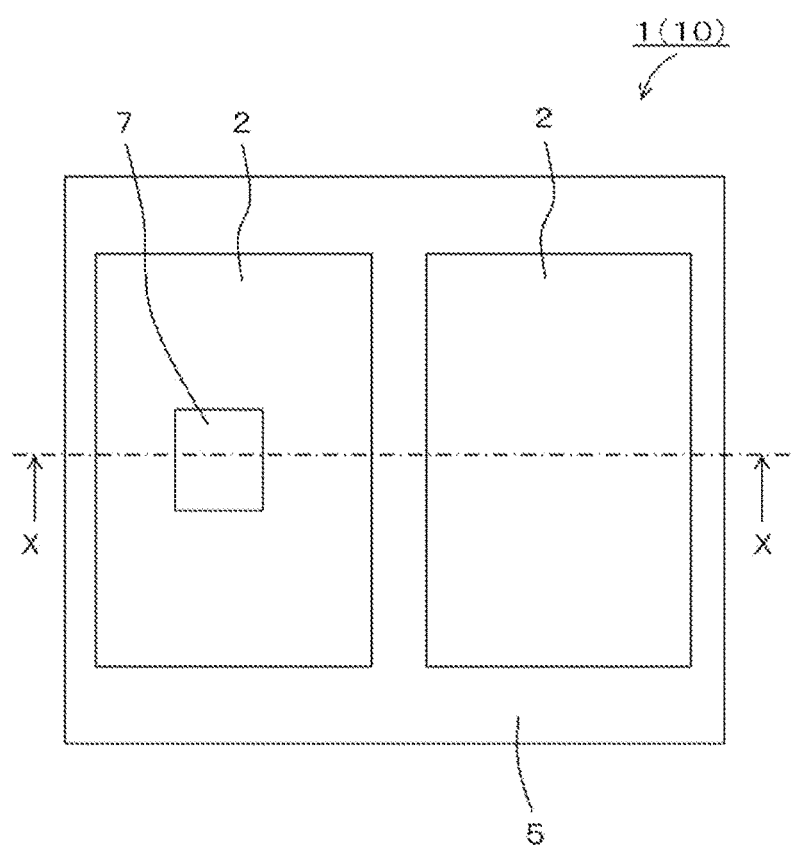
FIG. 1 is a top view of an electronic device including a circuit board according to a first embodiment of the present invention.

Illustrative embodiments of the present invention will be described below with reference to the drawings. In the drawings, an electronic device including a circuit board is disposed in an imaginary xyz space, and is mounted on an xy plane. In the embodiments, an upper side, an upper surface, and an upper part represent a positive direction of an imaginary z-axis, and a lower side, a lower surface, and a lower part represent a negative direction of the imaginary z-axis.

First Embodiment

Figure 2:
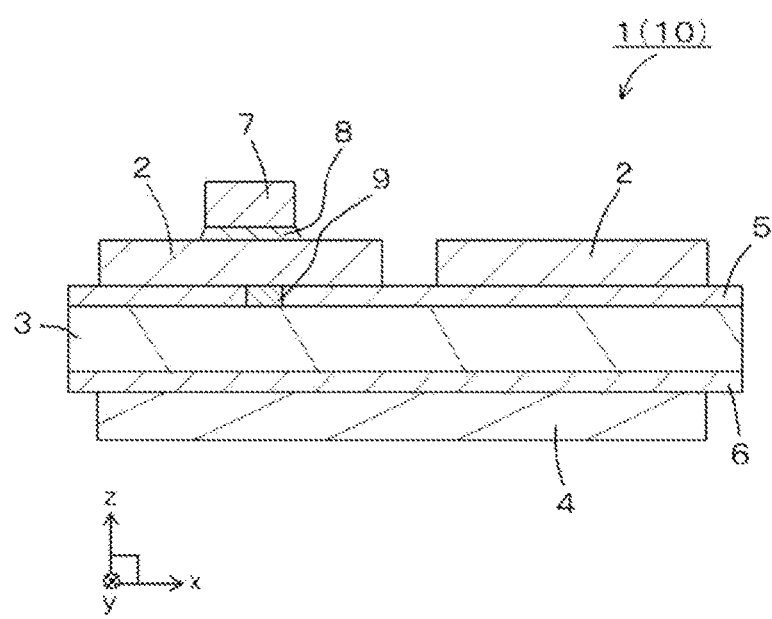
FIG. 2 is a cross-sectional view of the electronic device, taken along line X-X in FIG. 1.

A circuit board 1 and an electronic device 10 according to a first embodiment of the present invention will be described with reference to FIGS. 1 and 2. FIG. 1 is a top view of the electronic device 10 including the circuit board 1 according to the first embodiment of the present invention. FIG. 2 is a cross-sectional view of the electronic device 10, taken along line X-X in FIG. 1.

The circuit board 1 includes metal circuit plates 2, a metallic heat diffusing plate 3 below the metal circuit plates 2, a metallic heat dissipating plate 4 below the heat diffusing plate 3, an insulating substrate 5 (first insulating substrate) between the metal circuit plates 2 and the heat diffusing plate 3, and an insulating substrate 6 (second insulating substrate) between the heat diffusing plate 3 and the heat dissipating plate 4. An upper surface of the insulating substrate 5 is bonded to lower surfaces of the metal circuit plates 2, and a lower surface of the insulating substrate 5 is bonded to an upper surface of the heat diffusing plate 3. An upper surface of the insulating substrate 6 is bonded to a lower surface of the heat diffusing plate 3, and a lower surface of the insulating substrate 6 is bonded to an upper surface of the heat dissipating plate 4.

In the example illustrated in FIGS. 1 and 2, the electronic device 10 includes the circuit board 1 and an electronic component 7 mounted on the metal circuit plate 2.

The insulating substrates 5 and 6 are made of an electric insulating material. For example, the electric insulating material is a ceramic material such as an aluminum oxide based ceramic material, a mullite based ceramic material, a silicon carbide based ceramic material, an aluminum nitride based ceramic material, or a silicon nitride based ceramic material. Among these ceramic materials, a silicon carbide based ceramic material, an aluminum nitride based ceramic material, or a silicon nitride based ceramic material is preferably used in terms of thermal conductivity having an influence on heat dissipation. In terms of strength, a silicon nitride based ceramic material or a silicon carbide based ceramic material is preferably used.

The thickness of the insulating substrates 5 and 6 is preferably thin in terms of thermal conductivity, and is, for example, about 0.1 to 1 mm. The thickness of the insulating substrates 5 and 6 can be selected according to the size of the circuit board 1 or the thermal conductivity or strength of the used material. The insulating substrates 5 and 6 are rectangular in plan view. In the example illustrated in FIGS. 1 and 2, the insulating substrates 5 and 6 are equal in size in plan view. The size of the insulating substrates 5 and 6 in plan view is, for example, about 30 to 50 mm in short side and about 40 to 60 mm in long side.

When the insulating substrates 5 and 6 are made of, for example, a silicon nitride based ceramic material, the substrates can be produced by the following method. That is, first, a slurry is prepared by appropriately adding and mixing an organic binder, a plasticizer, and a solvent in base powder of, for example, silicon nitride, aluminum oxide, magnesium oxide, and yttrium oxide. Next, the slurry is shaped into a ceramic green sheet by a doctor blade method or a calender roll method. Next, a predetermined shape is given to this ceramic green sheet, for example, by an appropriate punching process, and a plurality of ceramic green sheets are stacked into a compact as required. After that, the stack is fired at a temperature of 1600° C. to 2000° C. in a non-oxidizing atmosphere such as a nitride atmosphere. Through the above-described steps, insulating substrates 5 and 6 are produced.

The metal circuit plates 2, the heat diffusing plate 3, and the heat dissipating plate 4 are each obtained, for example, by shaping a copper plate (not illustrated) by a predetermined metal working process, such as die punching, and then bonding the copper plate to the insulating substrate 5 or 6 by brazing.

The metal circuit plates 2, the heat diffusing plate 3, and the heat dissipating plate 4 are mainly composed of copper or aluminum in terms of electric resistance and thermal conductivity.

The brazing material for brazing is mainly composed of copper and silver, and further contains at least one of metal materials of titanium, hafnium, and zirconium as an active metal for bonding. The metal material, such as titanium, serving as the active metal material allows the brazing material to firmly bond the metal circuit plates 2, the heat diffusing plate 3, and the heat dissipating plate 4 to the insulating substrates 5 and 6. The brazing material will be described in detail later.

The metal circuit plates 2, the heat diffusing plate 3, and the heat dissipating plate 4 contain metal grains such as copper grains. The grain diameter of metal grains contained in the heat diffusing plate 3 decreases from the upper surface of the heat diffusing plate 3 toward a center portion of the heat diffusing plate 3 in a thickness direction (direction parallel to the z-axis). Also, the grain diameter of the metal grains decreases from the lower surface of the heat diffusing plate 3 toward the center portion of the heat diffusing plate 3 in the thickness direction.

In other words, the grain diameter of the metal grains contained in the heat diffusing plate 3 increases with decreasing distance from the upper surface of the heat diffusing plate 3 in a part of the heat diffusing plate 3 on an upper side of the center portion in the thickness direction. Also, the grain diameter of the metal grains increases with decreasing distance from the lower surface of the heat diffusing plate 3 in a part of the heat diffusing plate 3 on a lower side of the center portion in the thickness direction.

In this way, in a region at a short distance from the upper surface of the heat diffusing plate 3 in the part of the heat diffusing plate 3 on the upper side of the center portion in the thickness direction and a region at a short distance from the lower surface of the heat diffusing plate 3 in the part of the heat diffusing plate 3 on the lower side of the center portion in the thickness direction, the grain diameter of the metal grains is relatively larger than in a region between these regions. In these regions where the grain diameter of the metal grains is relatively large, the heat diffusing plate 3 relatively easily deforms. This deformation can relax stress generated by a thermal expansion mismatch between the insulating substrates 5 and 6 and the heat diffusing plate 3.

In a region at a long distance from the upper surface of the heat diffusing plate 3 in the part of the heat diffusing plate 3 on the upper side of the center portion in the thickness direction and a region at a long distance from the lower surface of the heat diffusing plate 3 in the part of the heat diffusing plate 3 on the lower side of the center portion in the thickness direction, the grain diameter of the metal grains is relatively smaller than in the regions at a short distance from the upper surfaces and the lower surfaces of the insulating substrates. In these regions where the grain diameter of the metal grains is relatively small, rigidity of the heat diffusing plate 3 is relatively high. Thus, the heat diffusing plate 3 rarely deforms as a whole.

Therefore, the heat diffusing plate 3 can be suppressed from warping when expanded and contracted by thermal history. Since the warp of the heat diffusing plate 3 is suppressed, warps of the insulating substrates 5 and 6 and the entire circuit board 1 are also suppressed, and this can reduce the stress to the insulating substrates 5 and 6 due to deformation. As a result, it is possible to provide the circuit board 1 that is advantageous in reliability while ensuring desired heat dissipation.

Further, the grain diameters of the metal grains contained in the metal circuit plates 2 and the heat dissipating plate 4 are preferably larger than the grain diameter of the metal grains contained in the heat diffusing plate 3.

In this way, when the grain diameters of the metal grains contained in the metal circuit plates 2 and the heat dissipating plate 4 are larger than the grain diameter of the metal grains contained in the heat diffusing plate 3, the metal circuit plates 2 and the heat dissipating plate 4 can follow the warp of the heat diffusing plate 3 with a smaller load. For this reason, the stress applied to the insulating substrates 5 and 6 can be reduced further.

Specific examples of the grain diameters of the metal grains contained in the metal circuit plates 2, the heat diffusing plate 3, and the heat dissipating plate 4 are as follows. That is, the grain diameter of the metal grains contained in the heat diffusing plate 3 is, for example, about 40 to 100 μm. In this case, the grain diameter of the metal grains contained in the heat diffusing plate 3 is about 90 to 100 μm in the region at a short distance from the upper surface of the heat diffusing plate 3 and the region at a short distance from the lower surface of the heat diffusing plate 3. In the remaining regions, that is, the region at a long distance from the upper surface and the region at a long distance from the lower surface, the grain diameter is about 40 to 50 μm, and is smaller than the grain diameter in the region at the short distance from the upper surface and the region at the short distance from the lower surface.

The grain diameter of the metal grains contained in the metal circuit plates 2 is, for example, about 100 to 130 μm, and is larger than the grain diameter of the metal grains contained in the heat diffusing plate 3. Further, the grain diameter of the metal grains contained in the heat dissipating plate 4 is, for example, about 100 to 130 μm, and is larger than the grain diameter of the metal grains contained in the heat diffusing plate 3. The ratio of the average grain diameters of the metal grains contained in the metal circuit plates 2, the heat diffusing plate 3, and the heat dissipating plate 4 is 23:15:23.

In this case, specific examples of thicknesses of the metal circuit plates 2, the heat diffusing plate 3, and the heat dissipating plate 4 are as follows. That is, for example, the thickness of the metal circuit plates 2 is about 0.3 to 0.5 mm, the thickness of the heat diffusing plate 3 is about 2 to 4 mm, and the thickness of the heat dissipating plate 4 is about 0.3 to 0.5 mm.

The grain diameters of the metal grains in the metal circuit plates 2, the heat diffusing plate 3, and the heat dissipating plate 4 can be detected, for example, by being measured by cross-sectional observation using a metaloscope. In this case, the grain diameters are calculated by a method generally called a sectioning method. In the sectioning method, a straight line is drawn on a sample cross section, and the number of metal grains crossed by the straight line is counted. The length obtained by dividing the length of the straight line by the counted number of metal grains is taken as a grain diameter. That is, the grain diameter in this case represents the average size of the metal grains crossed by the straight line.

For example, the following method may be adopted to set the grain diameter of the metal grains, such as copper grains, contained in the heat diffusing plate 3 to increase with decreasing distance from the upper surface of the heat diffusing plate 3 in the part of the heat diffusing plate 3 on the upper side of the center portion in the thickness direction and to increase with decreasing distance from the lower surface of the heat diffusing plate 3 in the part of the heat diffusing plate 3 on the lower side of the center portion in the thickness direction. That is, when the heat diffusing plate 3 is bonded to the insulating substrates 5 and 6, a brazing material having a high component diffusibility with respect to the metal (metal grains) of the heat diffusing plate 3 is used, and an alloy portion between the brazing material and the metal is made wide (thick) in the thickness direction.

When the heat diffusing plate 3 is bonded to the insulating substrates 5 and 6 with the brazing material, alloys of the heat diffusing plate 3 and the brazing material (for example, copper-silver) are formed near bonded surfaces. The melting point of the alloy portions is lower than that of the metal (main part of the heat diffusing plate 3). For this reason, at the time of bonding, the grains in the alloy portions grow at a temperature lower than a temperature at which the grains of the metal (main part of the heat diffusing plate 3) itself grows. Hence, the time of grain growth increases. Thus, the grain diameters of the metal grains in the alloy portions, that is, near the bonded surfaces becomes large. In contrast, since the diffusion amount of the brazing material component decreases with increasing distance from the upper surface and the lower surface of the heat diffusing plate 3, grain growth of the metal slows down. Thus, the metal grain diameter can be gradually decreased in the thickness direction. Further, since the above-described alloy portions are wide in the thickness direction, the grain diameter of the metal grains can be changed over a wide range.

For example, the grain diameters of the metal grains, such as copper grains, contained in the metal circuit plates 2 and the heat dissipating plate 4 can be made larger than the grain diameter of the metal grains, such as copper grains, contained in the heat diffusing plate 3 as follows. That is, the grain diameters of the metal grains in the metal circuit plates and the heat dissipating plate 4 are increased by annealing the metal circuit plates 2 and the heat dissipating plate 4 in a vacuum or nitrogen beforehand to recrystallize the metal grains.

When the metal circuit plates 2 and the heat dissipating plate 4 are simultaneously bonded to the heat diffusing plate 3 without being subjected to preprocessing such as annealing, the grain diameter of the metal grains near the bonded surfaces to the insulating substrates 5 and 6 is equal among the metal circuit plates 2, the heat diffusing plate 3, and the heat dissipating plate 4. On the other hand, since the heat diffusing plate 3 is thicker than the metal circuit plates 2 and the heat dissipating plate 4, the heat diffusing plate 3 includes a lot of regions where the grain diameter of the metal grains is small. For this reason, the average grain diameter of the metal grains is smaller in the heat diffusing plate 3 than in the metal circuit plates 2 and the heat dissipating plate 4. Therefore, as described above, rigidity of the heat diffusing plate 3 is high, and this can reduce stress to the insulating substrates 5 and 6 due to deformation.

As illustrated in FIGS. 1 and 2, the electronic component 7 is mounted on the upper surface of one of the metal circuit plates 2 with a bonding material 8 interposed therebetween, and this electronic component 7 is connected to the other metal circuit plate 2 by an unillustrated conductive connecting material (bonding wire). In this way, in the example of FIGS. 1 and 2, the metal circuit plates 2 are shaped like a circuit pattern, and function as a circuit conductor. The heat diffusing plate 3 has a function of spreading heat generated from the electronic component 7 mounted on the metal circuit plate 2 in the lateral direction. The heat dissipating plate 4 has a function of dissipating the heat generated from the electronic component 7 mounted on the metal circuit plate 2.

The metal circuit plates 2 are not limited to the circuit conductor, but also can be used as a metal member for mounting the electronic component 7 in the circuit board 1, a metal member for a ground conductor, or a heat dissipating plate. In this way, the metal circuit plates 2 are used while being bonded to the insulating substrate 5 made of, for example, a ceramic material, as a conductive path through which a relatively large current of, for example, about a several hundred amperes passes or a heat dissipating member.

The electronic component 7 is a semiconductor element such as a transistor, an LSI (Large Scale Integrated Circuit) for a CPU (Central Processing Unit), an IGBT (Insulated Gate Bipolar Transistor), or a MOS-FET (Metal Oxide Semiconductor-Field Effect Transistor).

For example, the bonding material 8 is made of metal or conductive resin. For example, the bonding material 8 is solder, a gold-tin (Au—Sn) alloy, or a tin-silver-copper (Sn—Ag—Cu) alloy.

A plated film may be formed on the surfaces of the metal circuit plates 2 by plating. According to this structure, wettability with the bonding material 8 is improved, and therefore, the electronic component 7 can be firmly bonded to the surfaces of the metal circuit plates 2. It is only required that the plated film should be made of a metal having a high conductivity and a high corrosion resistance, and for example, is made of nickel, cobalt, copper, or gold, or an alloy material mainly composed of any of these metal materials. The thickness of the plated film can be, for example, 1.5 to 10 μm.

When nickel is used as the material of the plated film, for example, the plated film is preferably made of a nickel-phosphorous amorphous alloy containing about 8 to 15 mass % of phosphorous in nickel. In this case, surface oxidation of the nickel-plated film can be suppressed, and wettability of the electronic component 7 with, for example, the bonding material 8 can be maintained for a long time. Further, when the phosphorous content of nickel is about 8 to 15 mass %, the nickel-phosphorous amorphous alloy is easily formed, and this can increase the bonding strength of, for example, the bonding material 8 to the plated film.

Since the electronic device 10 of this embodiment includes the above-described circuit board 1, it can effectively dissipate heat generated from the electronic component 7 and achieves high reliability.

The metal circuit plates 2, the heat diffusing plate 3, and the heat dissipating plate 4 are each preferably made of pure copper having a copper content higher than or equal to 99.99 mass %. This can increase the thermal conductivity of the metal circuit plates 2, the heat diffusing plate 3, and the heat dissipating plate 4, and can improve heat dissipation.

The insulating substrates 5 and 6 are preferably made of a silicon nitride based ceramic material. Thus, even when a thicker heat diffusing plate 3 is used, the risk of fracture of the insulating substrates 5 and 6 is reduced. Therefore, it is possible to achieve a circuit board that allows passage of a larger current while realizing miniaturization.

As illustrated in FIG. 2, the insulating substrate 5 bonded to the metal circuit plates 2 may have a through hole penetrating the insulating substrate 5 in the thickness direction, and a through conductor 9 may be formed inside the through hole to be electrically connected at one end to the metal circuit plates 2 and electrically connected at the other end to the heat diffusing plate 3.

By thus forming the through conductor 9, the heat diffusing plate 3 can be used as a return path for the current (signal). To ensure both a forward current path and a return current path in the layer constituted by the metal circuit plates 2, a space where both a forward conductor and a return conductor are disposed is necessary on the insulating substrate 5. In contrast, when the heat diffusing plate 3 is used as the return path for the current, as described above, a space where the return conductor is disposed is unnecessary, and this can realize miniaturization of the circuit board 1.

When the heat diffusing plate 3 is used as the return path for the current, a pattern serving as the forward current path and a pattern serving as the return current path face each other in plan. For this reason, electric coupling (mutual inductance) increases, and this can reduce the total inductance of the electronic device 10. Thus, the surge voltage is decreased, and the risk of breakage of the units is reduced.

By connecting the metal circuit plates 2 and the heat diffusing plate 3 through the through conductor 9, the inductance can be made less than when the metal circuit plates 2 and the heat diffusing plate 3 are connected by wire bonding. Further, since the space for connection using the bonding wire is unnecessary, space saving can be achieved.

Modification of First Embodiment

Figure 3:
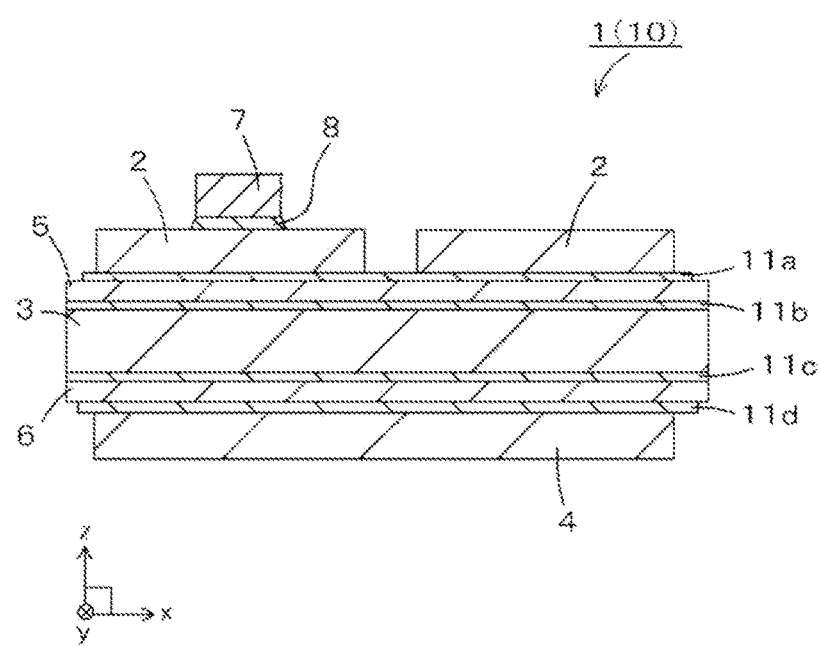
FIG. 3 is a cross-sectional view illustrating a modification of the electronic device including the circuit board according to the first embodiment of the present invention.
Figure 4:
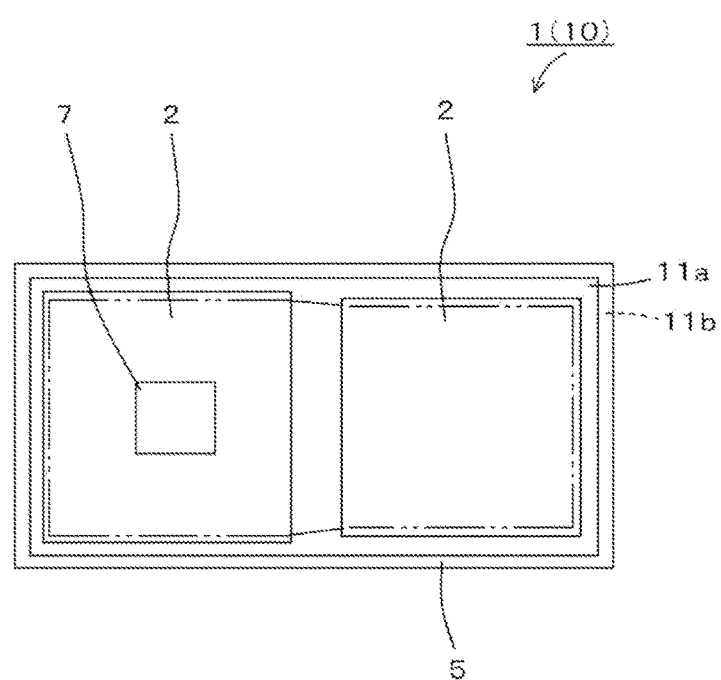
FIG. 4 is a top view of an example of the circuit board and the electronic devices of FIG. 3, when viewed from above.

A modification of the electronic device 10 including the circuit board 1 according to the first embodiment of the present invention will be described with reference to FIGS. 3 and 4. FIG. 3 is a cross-sectional view illustrating the modification of the electronic device 10 including the circuit board 1 according to the first embodiment of the present invention. FIG. 4 is a top view illustrating an example of the circuit board and the electronic device of FIG. 3, when viewed from above.

This modification is different from the above-described embodiment in that the relationship of the thermal expansion coefficient between brazing materials that bond metal plate portions, such as metal circuit plates 2, a heat diffusing plate 3, and a heat dissipating plate 4, and insulating substrate portions, such as insulating substrates 5 and 6, is set. In the following description, the metal plate portions, the insulating substrate portions, or the brazing materials are sometimes referred without being particularly distinguished.

In the circuit board 1 and the electronic device 10 in the modification, lower surfaces of metal circuit plates 2 and an upper surface of a first insulating substrate 5 are bonded together with a first brazing material 11a interposed therebetween. Also, an upper surface of a heat diffusing plate 3 and a lower surface of the first insulating substrate 5 are bonded together with a second brazing material 11b interposed therebetween. The thermal expansion coefficient of the first brazing material 11a at least in an outer peripheral portion thereof is higher than the thermal expansion coefficient of the second brazing material 11b.

In this modification, a lower surface of the heat diffusing plate 3 and an upper surface of a second insulating substrate 6 are bonded together with a third brazing material 11c interposed therebetween. Also, an upper surface of a heat dissipating plate 4 and a lower surface of the second insulating substrate 6 are bonded together with a fourth brazing material 11d interposed therebetween. The thermal expansion coefficient of the fourth brazing material 11d in at least an outer peripheral portion thereof is higher than the thermal expansion coefficient of the third brazing material 11c.

In the circuit board 1 and the electronic device 10 of the modification, stress generated between the insulating substrates 5 and 6 and the heat diffusing plate 3 can also be relaxed. For this reason, it is possible to suppress a warp of the heat diffusing plate 3 caused when the heat diffusing plate 3 is expanded and contacted by thermal history and to also suppress warps of the insulating substrates 5 and 6 and the entire circuit board 1.

Since the thermal expansion coefficients of the brazing materials 11a to 11d are set, as described above, thermal stress itself can be reduced, and the risk of a warp of the entire circuit board 1 can be effectively reduced. Such an effect of reduction of the thermal stress is obtained on both the upper side and the lower side of the heat diffusing plate 3.

In this modification, the structure on the upper side of the heat diffusing plate 3 (upper side structure) includes the following matters. That is, the lower surfaces of the metal circuit plates 2 and the upper surface of the first insulating substrate 5 are bonded together with the first brazing material 11a interposed therebetween, the upper surface of the heat diffusing plate 3 and the lower surface of the first insulating substrate 5 are bonded together with the second brazing material 11b interposed therebetween, and the thermal expansion coefficient of the first brazing material 11a in at least the outer peripheral portion thereof is higher than the thermal expansion coefficient of the second brazing material 11b.

Also, in this modification, the structure on the lower side of the heat diffusing plate 3 (lower side structure) includes the following matters. That is, the lower surface of the heat diffusing plate 3 and the upper surface of the second insulating substrate 6 are bonded together with the third brazing material 11c interposed therebetween, the upper surface of the heat dissipating plate 4 and the lower surface of the second insulating substrate 6 are bonded together with the fourth brazing material 11d interposed therebetween, and the thermal expansion coefficient of the fourth brazing material 11d at least in the outer peripheral portion thereof is higher than the thermal expansion coefficient of the third brazing material 11c.

First, the upper side structure will be described in detail. In the upper side structure, since the thermal expansion coefficient of the outer peripheral portion of the first brazing material 11a is relatively high, a force for warping an outer peripheral portion of the circuit board 1 is generated. The direction of this force is opposite from the direction of thermal stress resulting from the difference in thermal expansion coefficient between the heat diffusing plate 3 and the insulating substrate 5 having a thermal expansion coefficient lower than that of the heat diffusing plate 3. For this reason, these forces cancel each other, and this effectively reduces the risk of warping the entire circuit board 1.

Therefore, mechanical breakage, such as cracking of the insulating substrate 5, resulting from the warp of the entire circuit board 1 can be more effectively suppressed. That is, it is possible to provide the circuit board 1 that allows production of the electronic device 10 which has a high long-term reliability and which suppresses, for example, cracking of the insulating substrate 5.

The outer peripheral portion of the first brazing material 11a is at least a portion outside the outer periphery of the metal circuit plates 2 (a visible portion unhidden by the metal circuit plates 2 when viewed from above). However, this outer peripheral portion may include a portion slightly shifted inward from the outer periphery of the metal circuit plates 2. In the example illustrated in FIG. 4, the outer peripheral portion is a portion of the first brazing material 11a outside an imaginary line shown by a two-dot chain line.

In the circuit board 1 and the electronic device 10 of this modification, for example, the first brazing material 11a and the second brazing material 11b contain at least one of copper and silver as a main component. The first brazing material 11a and the second brazing material 11b further contain, as an additive, at least one of the metal materials of molybdenum, titanium, zirconium, hafnium, and niobium serving as an active metal for bonding. Among these metal materials, molybdenum, titanium, and zirconium are particularly suitable in consideration of, for example, effectiveness as the active metal, brazing operability, and economy (cost).

The content of the additive, such as molybdenum, titanium, and zirconium, in at least the outer peripheral portion of the first brazing material 11a is lower than that of the second brazing material 11b. In other words, the content of the main component (at least one of copper and silver) in at least the outer peripheral portion of the first brazing material 11a is higher than that of the second brazing material 11b. Thus, the thermal expansion coefficient of at least the outer peripheral portion of the first brazing material 11a is higher than that of the second brazing material 11b. When the thermal expansion coefficients of the metals are expressed as linear expansion coefficients at 20° C. (about 293 K), copper is $16.5 \times 10^{-6}$ 1/K, silver is $18.9 \times 10^{-6}$ 1/K, molybdenum is $3.7 \times 10^{-6}$ 1/K, titanium is $8.6 \times 10^{-6}$ 1/K, and zirconium is $5.4 \times 10^{-6}$ 1/K in the linear expansion coefficient (from Chronological Scientific Tables, 2011, 84th ed.).

For example, the outer peripheral portion of the first brazing material 11a has such a composition that copper is 15 to 80 mass %, silver is 15 to 65 mass %, titanium is 1 to 20 mass %, and molybdenum is about 0 to 5 mass %. For example, the second brazing material 11b has such a composition that copper is 15 to 75 mass %, silver is 15 to 65 mass %, titanium is 1 to 20 mass %, and molybdenum is about 0 to 5 mass %.

More specific examples are as follows. That is, for example, the outer peripheral portion of the first brazing material 11a has such a composition that copper is 80 mass %, silver is 19.3 mass %, titanium is 0.5 mass %, and molybdenum is 0.2 mass %. When the outer peripheral portion of the first brazing material 11a has this composition, the second brazing material 11b has, for example, such a composition that copper is 70 mass %, silver is 25.5 mass %, titanium is 4 mass %, and molybdenum is 0.5 mass %.

Portions of the first brazing material 11a other than the outer peripheral portion (for example, a center portion under the metal circuit plates 2) may have the same composition as that of the outer peripheral portion, or may have the same composition as that of the second brazing material 11b.

Below is an example of a method for making the content of the additive, such as molybdenum, titanium, and zirconium, in the outer peripheral portion of the first brazing material 11a lower than that of the second brazing material 11b. First, a water solution of ferric chloride (iron chloride (III), $FeCL_3$) is prepared. After that, a first brazing material 11a containing the above-described additive (which bonds the heat diffusing plate 3 and the insulating substrate 5) is immersed in the water solution, and the additive is eluted into the water solution from, for example, an exposed portion of the first brazing material 11a (outer peripheral portion). By the above method, the content of the additive in the outer peripheral portion of the first brazing material 11a can be decreased.

Alternatively, a material having an additive content lower than that of the second brazing material 11b may be used as the first brazing material 11a. In this case, the thermal expansion coefficient is higher than that of the second brazing material 11b in the entire first brazing material 11a.

In the circuit board 1 and the electronic device 10 illustrated in FIGS. 3 and 4, a part of the outer peripheral portion of the first brazing material 11a is located outside the outer periphery of the metal circuit plates 2. That is, at least a part of the outer peripheral portion of the first brazing material 11a may be located outside the outer periphery of the metal circuit plates 2. In other words, a part of the first brazing material 11a may protrude outward from the portion between the metal circuit plates 2 and the insulating substrate 5.

When at least a part of the outer peripheral portion of the first brazing material 11a is located outside the outer periphery of the metal circuit plates 2, the first brazing material 11a having a relatively high thermal expansion coefficient extends to a position closer to the outer periphery of the entire circuit board 1. For this reason, at the position closer to the outer periphery of the circuit board 1, a force for warping the circuit board 1 in a direction opposite from the warp direction of the heat diffusing plate 3 can be obtained. Thus, on the upper side of the circuit board 1 (insulating substrate 5), a force for cancelling the force on the lower side of the circuit board 1 (insulating substrate 5) can be generated. Therefore, the warp of the entire circuit board 1 is suppressed more effectively.

Next, the lower side structure will be described in detail. The lower side structure is such that the above-described upper side structure is turned upside down. The effect of the lower side structure is similar to the effect of the upper side structure. For this reason, descriptions of points similar to those of the upper side are simplified or skipped.

In the lower side structure, since the thermal expansion coefficient in the outer peripheral portion of the fourth brazing material 11d is relatively high, a force for warping the outer peripheral portion of the circuit board 1 is generated. The direction of this force is opposite from the direction of thermal stress resulting from the difference in thermal expansion coefficient between the heat diffusing plate 3 and the insulating substrate 6 having a thermal expansion coefficient lower than that of the heat diffusing plate 3. For this reason, these forces cancel each other, and this effectively reduces the risk of warping the entire circuit board 1.

Therefore, mechanical breakage, such as cracking of the insulating substrate 6, resulting from the warp of the entire circuit board 1 can be more effectively suppressed. That is, it is possible to provide the circuit board 1 that allows production of the electronic device 10 which has a high long-term reliability and suppresses, for example, cracking of the insulating substrate 6.

The outer peripheral portion of the fourth brazing material 11d is a portion outside at least the outer periphery of the heat dissipating plate 4 (a visible portion unhidden by the heat dissipating plate 4 when viewed from below) similarly to the first brazing material 11a. This outer peripheral portion may include a part slightly shifted inward from the outer periphery of the heat dissipating plate 4.

For example, the composition of the fourth brazing material 11d is similar to the composition of the first brazing material 11a. For example, the composition of the outer peripheral portion of the fourth brazing material 11d is similar to the composition of the outer peripheral portion of the first brazing material 11a. The composition of a portion of the fourth brazing material 11d other than the outer peripheral portion (for example, a center portion on the heat dissipating plate 4) may be the same as that of the outer peripheral portion or may be the same as that of the third brazing material 11c.

For example, the composition of the third brazing material 11c may be similar to the composition of the second brazing material 11b. The content of the additive, such as molybdenum, titanium, and zirconium, in the outer peripheral portion of the fourth brazing material 11d is lower than the content of the above additive in the third brazing material 11c. Thus, the thermal expansion coefficient in the outer peripheral portion of the fourth brazing material 11d is higher than the thermal expansion coefficient of the third brazing material.

A method for making the content of the additive in the outer peripheral portion of the fourth brazing material 11d lower than in the third brazing material 11c is similar to the method for the first brazing material 11a. That is, the method for eluting the additive from the outer peripheral portion of the fourth brazing material 11d into a water solution of ferric chloride (iron chloride (III), $FeCl_3$) can be used. Alternatively, a material having an additive content lower than that of the third brazing material 11c may be used as the fourth brazing material 11d. In this case, the thermal expansion coefficient is higher than that of the third brazing material 11c in the entire fourth brazing material 11d.

In the circuit board 1 and the electronic device 10 illustrated in FIGS. 3 and 4, a part of the outer peripheral portion of the fourth brazing material 11d is located outside the outer periphery of the heat dissipating plate 4. That is, at least a part of the outer peripheral portion of the fourth brazing material 11d may be located outside the outer periphery of the heat dissipating plate 4. In other words, a part of the fourth brazing material 11d may protrude outward from the portion between the heat dissipating plate 4 and the insulating substrate 6.

Similarly to the above-described first brazing material 11a, when at least a part of the outer peripheral portion of the fourth brazing material 11d is located outside the outer periphery of the heat dissipating plate 4, the fourth brazing material 11d having a relatively high thermal expansion coefficient extends to a position closer to the outer periphery of the entire circuit board 1. For this reason, a force for warping the circuit board 1 in a direction opposite from the warp direction of the heat diffusing plate 3 is obtained at the position closer to the outer periphery of the circuit board 1. Thus, on the lower side of the circuit board 1 (insulating substrate 6), the force for canceling the force on the upper side of the circuit board 1 (insulating substrate 6) can be more effectively generated. Therefore, the warp of the entire circuit board 1 is suppressed more effectively.

Figure 5:
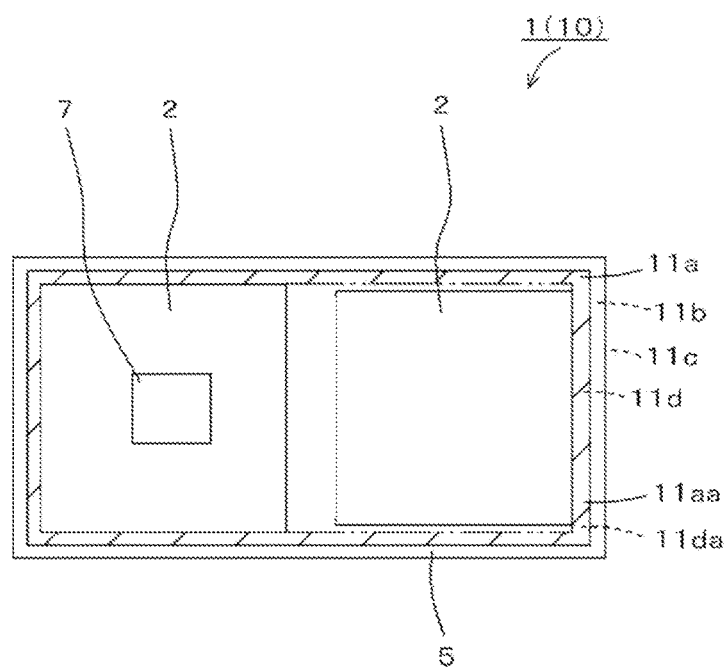
FIG. 5 is a top view of another example of the circuit board and the electronic device of FIG. 3, when viewed from above.

With reference to FIG. 5, another modification of the electronic device 10 including the circuit board 1 according to the first embodiment of the present invention will be described. FIG. 5 is a top view illustrating another example of the circuit board 1 and the electronic device 10 of FIG. 3 when viewed from above. In this modification, metal plate portions, insulating substrate portions, and brazing material portions are similar to those in the above-described modification. Descriptions of these similar points are skipped.

In the modification of FIG. 5, lower surfaces of metal circuit plates 2 and an upper surface of an insulating substrate 5 are also bonded together with a first brazing material 11a interposed therebetween. An upper surface of a heat diffusing plate 3 and a lower surface of the insulating substrate 5 are bonded together with a second brazing material 11b interposed therebetween. The thermal expansion coefficient of at least an outer peripheral portion of the first brazing material 11a is higher than the thermal expansion coefficient of the second brazing material 11b.

A lower surface of the heat diffusing plate 3 and an upper surface of an insulating substrate 6 are bonded together with a third brazing material 11c interposed therebetween, and an upper surface of a heat dissipating plate 4 and a lower surface of the insulating substrate 6 are bonded together with a fourth brazing material 11d interposed therebetween. The thermal expansion coefficient of at least an outer peripheral portion of the fourth brazing material 11d is higher than the thermal expansion coefficient of the third brazing material 11c.

In the circuit board 1 and the electronic device 10 of this modification, the following points are specified. That is, in this modification, the first brazing material 11a and the fourth brazing material 11d have the same composition, and an outer peripheral portion of the first brazing material 11a and an outer peripheral portion of the fourth brazing material 11d are aligned with each other in a transparent plan view. Although FIG. 5 is not a cross-sectional view, the aligned portion between the outer peripheral portion of the first brazing material 11a and the outer peripheral portion of the fourth brazing material 11d is hatched.

When the first brazing material 11a and the fourth brazing material 11d have the same composition and the outer peripheral portion of the first brazing material 11a and the outer peripheral portion of the fourth brazing material 11d are aligned with each other, stresses that are equal in magnitude and opposite in direction are generated in the outer peripheral portion of the first brazing material 11a and the outer peripheral portion of the fourth brazing material 11d. That is, the same degree of effect of suppressing the warp of the entire circuit board 1 is obtained in the upper side structure and the lower side structure. In other words, symmetry of stress in the up-down direction (vertical direction) is improved in the entire circuit board 1. For this reason, the warp of the entire circuit board 1 can be effectively suppressed. Therefore, it is possible to provide the circuit board advantageously improved in heat dissipation and reliability.

As long as the second brazing material 11b and the third brazing material 11c have the same composition, symmetry of stress in the up-down direction (vertical direction) is also improved in the entire circuit board 1. Thus, it is possible to provide a circuit board in which the warp of the entire circuit board 1 is effectively suppressed and heat dissipation and reliability are advantageously improved.

Second Embodiment

Figure 6:
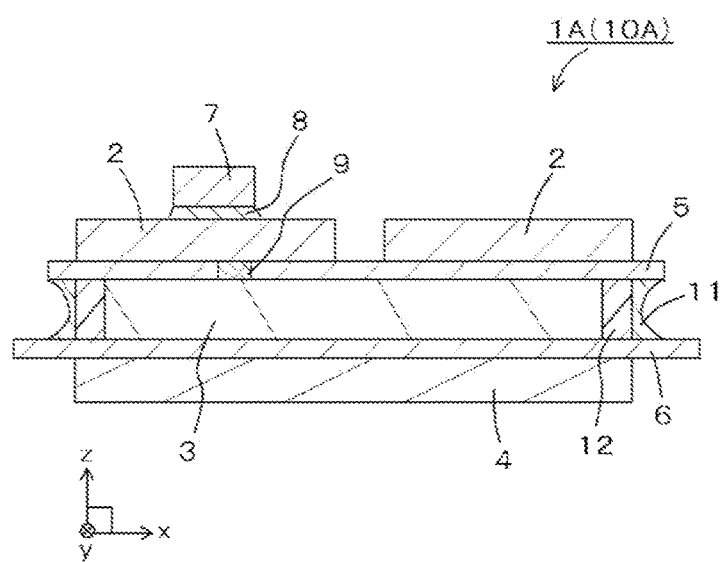
FIG. 6 is a cross-sectional view of an electronic device including a circuit board according to a second embodiment of the present invention.

A circuit board 1A and an electronic device 10A according to a second embodiment of the present invention will be described with reference to FIG. 6. FIG. 6 is a cross-sectional view of the electronic device 10A including the circuit board 1A according to the second embodiment of the present invention.

The circuit board 1A of this embodiment is different from the above-described circuit board 1 of the first embodiment in that an alloy layer 12 containing a component of a heat diffusing plate 3 and a component of a brazing material 11 is disposed on a side surface of the heat diffusing plate 3. The electronic device 10A includes the circuit board 1A and an electronic component 7 mounted on a metal circuit plate 2.

The brazing material 11 may be either the second brazing material 11b or the third brazing material 11c described above. When the second brazing material 11b and the third brazing material 11c have the same composition, both the second brazing material 11b and the third brazing material 11c may constitute the brazing material 11. For example, the brazing material 11 can be the same as the brazing material that is mainly composed of copper and silver, further contains at least one of metal materials of titanium, hafnium, and zirconium as an active metal for bonding, and brazes metal circuit plates 2, the heat diffusing plate 3, a heat dissipating plate 4, and insulating substrates 5 and 6. The alloy layer 12 is formed by, for example, the following method. First, a recess, such as a groove, extending in the thickness direction of the heat diffusing plate 3 is formed in a side surface of the heat diffusing plate 3 so that the brazing material 11 is easily attached. After that, in the state in which the brazing material 11 is attached to the side surface of the heat diffusing plate 3, the insulating substrates 5 and 6 and the heat diffusing plate 3 are bonded together. Then, the component of the brazing material 11 on the side surface of the heat diffusing plate 3 is diffused to the heat diffusing plate 3 by heating for bonding, so that an alloy layer 12 is formed.

On the side surface of the heat diffusing plate 3, the alloy layer 12 extends from an upper surface to a lower surface of the heat diffusing plate 3. That is, the alloy layer 12 entirely covers the side surface of the heat diffusing plate 3. To form such an alloy layer 12, the size of the heat diffusing plate 3 is smaller than the size of the insulating substrates 5 and 6 in plan view.

When the metal circuit plates 2, the heat diffusing plate 3, and the heat dissipating plate 4 are made of pure copper having a copper content more than or equal to 99.99 mass %, the thermal expansion coefficient thereof is about $16.5 \times 10^{-6}/°C$. In this case, when the used brazing material 11 has such a composition that copper is 15 to 75 mass %, silver is 20 to 65 mass %, and titanium is about 1 to 20 mass %, the thermal expansion coefficient of the alloy layer 12 is about $20 \times 10^{-6}/°C$.

According to the circuit board 1A of this embodiment, since the thermal expansion coefficient of the alloy layer 12 entirely covering the side surface of the heat diffusing plate 3 is higher than the thermal expansion coefficient of the heat diffusing plate 3 and so on, deformation of the heat diffusing plate 3 and so on due to thermal history can be suppressed more effectively. For example, the reason therefor is as follows. That is, when the temperature of the circuit board 1A increases, the heat diffusing plate 3 and the alloy layer 12 both expand, and press each other. At this time, when the thermal expansion coefficient of the alloy layer 12 is higher, the force of the alloy layer 12 for pressing the heat diffusing plate 3 inward is strong, and therefore, outward expansion of the heat diffusing plate 3 can be suppressed. When the temperature decreases, the heat diffusing plate 3 and the alloy layer 12 both contract and pull each other. Since the thermal expansion coefficient of the alloy layer 12 is higher and the force of the alloy layer 12 for pulling the heat diffusing plate 3 outward is strong, inward contraction of the heat diffusing plate 3 can be suppressed. In other words, expansion and contraction of the heat diffusing plate 3 are further suppressed by the alloy layer 12 that expands and contracts more than the heat diffusing plate 3.

Third Embodiment

Figure 7:
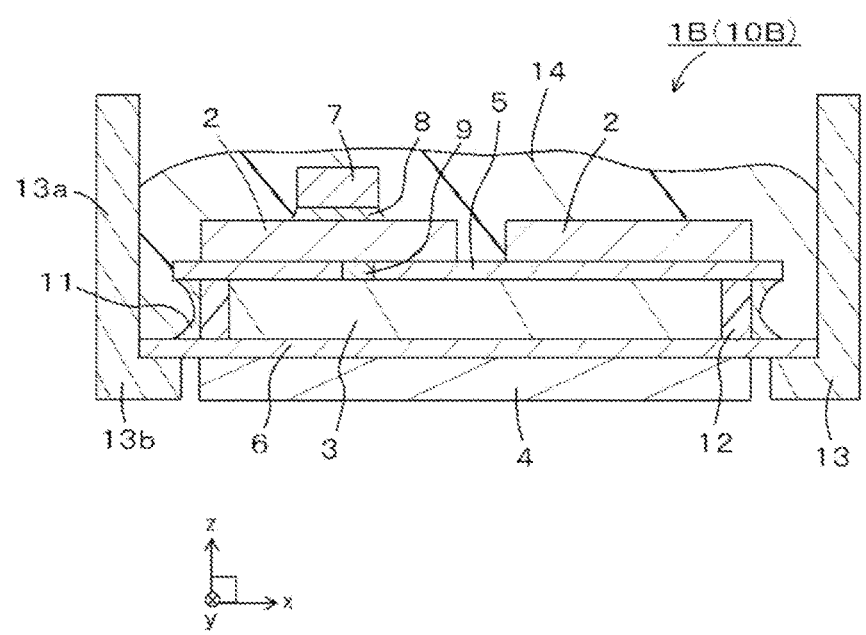
FIG. 7 is a cross-sectional view of an electronic device including a circuit board according to a third embodiment of the present invention.

With reference to FIG. 7, a description will be given of a circuit board 1B and an electronic device 10B according to a third embodiment of the present invention. FIG. 7 is a cross-sectional view of the electronic device 10B including the circuit board 1B according to the third embodiment of the present invention.

The circuit board 1B of this embodiment is different from the above-described circuit board 1A of the second embodiment in further including a frame 13 and an insulating resin 14. The electronic device 10B includes the circuit board 1B and an electronic component 7 mounted on a metal circuit plate 2.

In this embodiment, to dispose the frame 13, the size of a lower insulating substrate 6, that is, an insulating substrate 6 bonded to a heat dissipating plate 4 is larger than the size of an upper insulating substrate 5 in plan view, and a side surface of the insulating substrate 6 is located outside a side surface of the insulating substrate 5.

The frame 13 is embodied by a cylindrical body that surrounds the side surface of the insulating substrate 6 bonded to the heat dissipating plate 4. In the example of FIG. 7, the frame 13 is composed of a cylindrical portion 13a shaped like a square cylinder and an inward-extending flange portion 13b at a lower end of the cylindrical portion 13a. The frame 13 is preferably made of a material having a Young's modulus higher than or equal to that of the material of the insulating substrate 6. For example, the dimension of the cylindrical portion 13a in the axial direction (direction parallel to the z-axis) is selected to be greater than the distance between upper surfaces of the metal circuit plates 2 and a lower surface of the insulating substrate 6.

The circuit board 1B is structured by bonding an upper surface of the flange portion 13b of the frame 13 and a peripheral edge region of the lower surface of the insulating substrate 6 by adhesion with adhesive or brazing.

According to the circuit board 1B of this embodiment, such a frame 13 can increase the total rigidity of the circuit board 1B and even more effectively suppress a warp of the entire circuit board 1B.

As illustrated in FIG. 7, isolation is required between the heat diffusing plate 3 and the heat dissipating plate 4 when the insulating substrate 5 bonded to the metal circuit plates 2 has a through hole penetrating the insulating substrate 5 in the thickness direction and a through conductor 9 is disposed inside the through hole to be electrically connected at one end to the metal circuit plates 2 and to be electrically connected at the other end to the heat diffusing plate 3, that is, when the heat diffusing plate 3 has a potential.

Accordingly, in this embodiment, the inside of the frame 13 is filled with the insulating resin 14 that entirely covers the circuit board 1B from above. This can improve isolation between the heat diffusing plate 3 and the heat dissipating plate 4.

Fourth Embodiment

Figure 8:
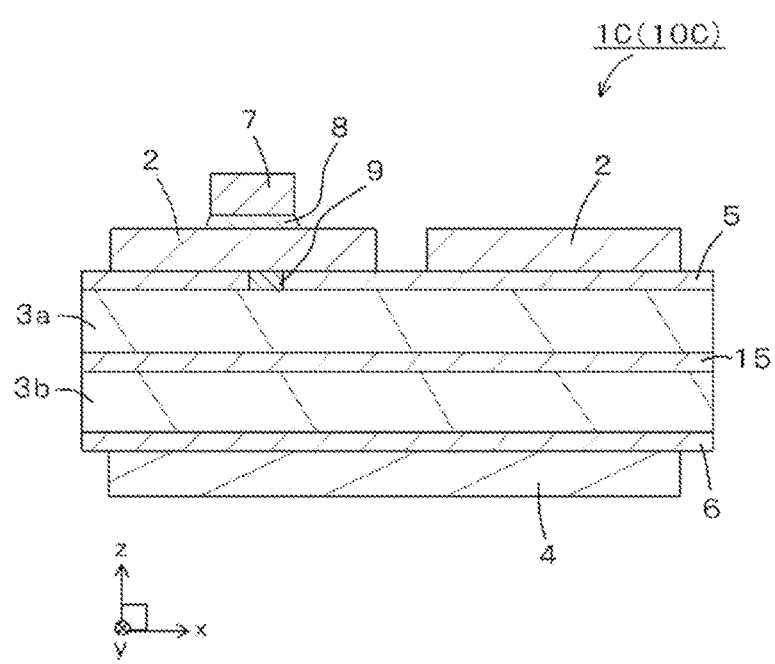
FIG. 8 is a cross-sectional view of an electronic device including a circuit board according to a fourth embodiment of the present invention.

With reference to FIG. 8, a description will be given of a circuit board 1C and an electronic device 10C according to a fourth embodiment of the present invention. FIG. 8 is a cross-sectional view of the electronic device 10C including the circuit board 1C according to the fourth embodiment of the present invention.

The circuit board 1C of this embodiment is different from the above-described circuit board 1 of the first embodiment in that a plurality of heat diffusing plates is disposed between metal circuit plates 2 and a heat dissipating plate 4. In the example of FIG. 8, two heat diffusing plates 3a and 3b are disposed between the metal circuit plates 2 and the heat dissipating plate 4. Such a circuit board 1C is advantageous, for example, in the following case. That is, while thermal conductivity of the circuit board 1 can be further enhanced by increasing the thickness of the heat diffusing plate 3, if the thickness of the heat diffusing plate 3 is merely increased, stress to the insulating substrates 5 and 6 increases. In contrast, when the plural heat diffusing plates 3a and 3b are stacked as in the circuit board 1C of the fourth embodiment, for example, the obtained thermal conductivity is similar to that when the thickness of the heat diffusing plate 3 in the circuit board 1 of the first embodiment is increased. Since the heat diffusing plates 3a and 3b are relatively thin, the stress to the insulating substrates 5 and 6 can be reduced. The electronic device 10C includes the circuit board 1C and an electronic component 7 mounted on the metal circuit plates 2.

The circuit board 1C includes metal circuit plates 2, two metallic heat diffusing plates 3a and 3b below the metal circuit plates 2, a metallic heat dissipating plate 4 below the two heat diffusing plates 3a and 3b, an insulating substrate 5 between the metal circuit plates 2 and the upper heat diffusing plate 3a, an insulating substrate 6 between the lower heat diffusing plate 3b and the heat dissipating plate 4, and an insulating substrate 15 (third insulating substrate) between the upper heat diffusing plate 3a and the lower heat diffusing plate 3b. An upper surface of the insulating substrate 5 is bonded to lower surfaces of the metal circuit plates 2, and a lower surface of the insulating substrate 5 is bonded to an upper surface of the upper heat diffusing plate 3a. An upper surface of the insulating substrate 6 is bonded to a lower surface of the lower heat diffusing plate 3b, and a lower surface of the insulating substrate 6 is bonded to an upper surface of the heat dissipating plate 4. An upper surface of the insulating substrate 15 is bonded to a lower surface of the upper heat diffusing plate 3a, and a lower surface of the insulating substrate 15 is bonded to an upper surface of the lower heat diffusing plate 3b.

The grain diameter of metal grains contained in the heat diffusing plate 3a decreases from the upper surface of the heat diffusing plate 3a toward a center portion of the heat diffusing plate 3a in the thickness direction (direction parallel to the z-axis), and decreases from the lower surface of the heat diffusing plate 3a toward the center portion of the heat diffusing plate 3a in the thickness direction.

Similarly, the grain diameter of metal grains contained in the heat diffusing plate 3b decreases from the upper surface of the heat diffusing plate 3b toward a center portion of the heat diffusing plate 3b in the thickness direction (direction parallel to the z-axis), and decreases from the lower surface of the heat diffusing plate 3b toward the center portion of the heat diffusing plate 3b in the thickness direction.

When the plural heat diffusing plates 3a and 3b are disposed between the metal circuit plates 2 and the heat dissipating plate 4 as in this embodiment, a warp of the heat diffusing plates 3a and 3b caused by expansion and contraction of the heat diffusing plates 3a and 3b due to thermal history can be suppressed, similarly to the first embodiment, by setting the grain diameters of the metal grains contained in the heat diffusing plates 3a and 3b in the above-described manner. Since the warp of the heat diffusing plates 3a and 3b is suppressed, warps of the insulating substrates 5 and 6 and the entire circuit board 1C are suppressed, and this can reduce the stress to the insulating substrates 5 and 6 due to deformation. Hence, it is possible to provide the circuit board 1C that has high reliability while ensuring desired heat dissipation.

While the circuit board 1C includes the two heat diffusing plates 3a and 3b in the example of FIG. 8, the structure is not limited thereto, the circuit board 1C may include three or more heat diffusing plates. At this time, the sum of the thicknesses of the heat diffusing plates and the insulating substrates between the heat diffusing plates is preferably set within such a range that the heat resistance due to the sum of thicknesses is not more than heat dissipation.

In the circuit board 1C of this embodiment, deformation of the heat diffusing plates and so on due to thermal history can be more effectively suppressed by providing a side surface of each of the heat diffusing plates with an alloy layer containing a component of the heat diffusing plate and a component of a brazing material, as in the above-described second embodiment. Also, the warp of the entire circuit board can be more effectively suppressed by bonding a frame to the insulating substrate 6, as in the above-described third embodiment.

Figure 9:
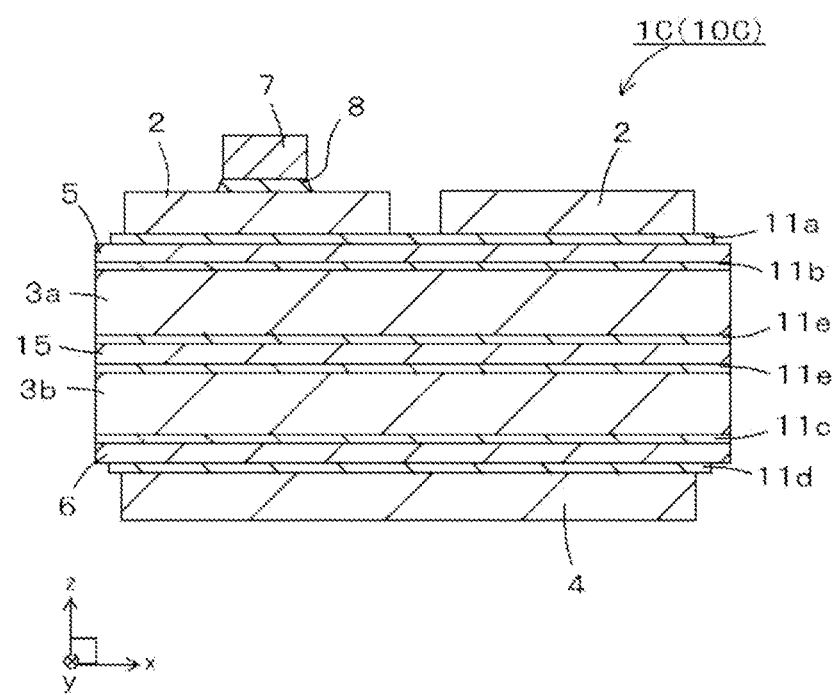
FIG. 9 is a cross-sectional view illustrating a modification of the electronic device including the circuit board according to the fourth embodiment of the present invention.

With reference to FIG. 9, a description will be given of a modification of the electronic device 10C including the circuit board 1C according to the fourth embodiment of the present invention. FIG. 9 is a cross-sectional view illustrating the modification of the electronic device 10C including the circuit board 1C of the fourth embodiment of the present invention. In this modification, metal plate portions, insulating substrate portions, and brazing material portions are similar to those in the above-described fourth embodiment. Descriptions of these similar points are skipped.

In the circuit board 1C and the electronic device 10C according to the modification of the fourth embodiment, the thermal expansion coefficient of the brazing material portions is set similarly to the circuit board 1 and the electronic device 10 according to the modification of the first embodiment. In other words, the circuit board 1C and the electronic device 10C in the modification of the fourth embodiment are different from the circuit board 1 and the electronic device 10 in the modification of the first embodiment in that the heat diffusing plate 3 is replaced with a plurality of heat diffusing plates 3a and 3b and an insulating substrate 15 is disposed therebetween.

In this modification, lower surfaces of metal circuit plates 2 and an upper surface of an insulating substrate 5 are also bonded together with a first brazing material 11a interposed therebetween. An upper surface of the heat diffusing plate 3a and a lower surface of the insulating substrate 5 are bonded together with a second brazing material 11b interposed therebetween. The thermal expansion coefficient of at least an outer peripheral portion of the first brazing material 11a is higher than the thermal expansion coefficient of the second brazing material 11b.

A lower surface of the heat diffusing plate 3b and an upper surface of an insulating substrate 6 are bonded together with a third brazing material 11c interposed therebetween, and an upper surface of a heat dissipating plate 4 and a lower surface of the insulating substrate 6 are bonded together with a fourth brazing material 11d interposed therebetween. The thermal expansion coefficient of at least an outer peripheral portion of the fourth brazing material 11d is higher than the thermal expansion coefficient of the third brazing material 11c.

Therefore, in this modification, the effect of suppressing the warp of the entire circuit board 1C can be obtained, similarly to the modification of the first embodiment.

The heat diffusing plates 3a and 3b and the insulating substrate 15 therebetween are bonded together with fifth brazing materials 11e.

For example, the fifth brazing materials 11e can have a composition similar to that of the second brazing material 11b or the third brazing material 11c. The upper and lower fifth brazing materials 11e may have the same composition. When these fifth brazing materials 11e have the same composition, symmetry of stress in the up-down direction (vertical direction) of the entire circuit board 1C is improved. For this reason, the warp of the entire circuit board 1C is advantageously suppressed.

The second brazing material 11b, the third brazing material 11c, and the upper and lower fifth brazing materials 11e may have the same composition. When these brazing materials have the same composition, symmetry of stress in the up-down direction (vertical direction) of the entire circuit board 1C is further improved. Therefore, the warp of the entire circuit board 1C can be effectively suppressed. That is, reliability of the circuit board is also advantageously enhanced.

REFERENCE SIGNS LIST 1, 1A, 1B, 1C circuit board
2 metal circuit plate
3 heat diffusing plate
4 heat dissipating plate
5 insulating substrate
6 insulating substrate
7 electronic component
8 bonding material
9 through conductor
10, 10A, 10B, 10C electronic device
11 brazing material
11a first brazing material
11b second brazing material
11c third brazing material
11d fourth brazing material
11e fifth brazing material
12 alloy layer
13 frame
14 insulating resin
15 insulating substrate

The invention claimed is:
1. A circuit board comprising:
a metal circuit plate;
a metallic heat diffusing plate below the metal circuit plate;

a metallic heat dissipating plate below the heat diffusing plate;
a first insulating substrate disposed between the metal circuit plate and the heat diffusing plate and comprising an upper surface bonded to a lower surface of the metal circuit plate and a lower surface bonded to an upper surface of the heat diffusing plate; and
a second insulating substrate disposed between the heat diffusing plate and the heat dissipating plate and comprising an upper surface bonded to a lower surface of the heat diffusing plate and a lower surface bonded to an upper surface of the heat dissipating plate,
wherein a grain diameter of metal grains contained in the heat diffusing plate decreases from each of the upper surface and the lower surface of the heat diffusing plate toward a center portion of the heat diffusing plate in a thickness direction.

2. The circuit board according to claim 1, wherein particle diameters of metal grains contained in the metal circuit plate and the heat dissipating plate are larger than the grain diameter of the metal grains contained in the heat diffusing plate.

3. The circuit board according to claim 1,
wherein the lower surface of the metal circuit plate and the upper surface of the first insulating substrate are bonded together with a first brazing material interposed therebetween, and the upper surface of the heat diffusing plate and the lower surface of the first insulating substrate are bonded together with a second brazing material interposed therebetween, and
wherein a thermal expansion coefficient of the first brazing material in at least an outer peripheral portion of the first brazing material is higher than a thermal expansion coefficient of the second brazing material.

4. The circuit board according to claim 3, wherein at least a part of the outer peripheral portion of the first brazing material is located outside an outer periphery of the metal circuit plate.

5. The circuit board according to claim 1,
wherein the lower surface of the heat diffusing plate and the upper surface of the second insulating substrate are bonded together with a third brazing material interposed therebetween, and the upper surface of the heat dissipating plate and the lower surface of the second insulating substrate are bonded together with a fourth brazing material interposed therebetween, and
wherein a thermal expansion coefficient of the fourth brazing material in at least an outer peripheral portion of the fourth brazing material is higher than a thermal expansion coefficient of the third brazing material.

6. The circuit board according to claim 5, wherein at least a part of the outer peripheral portion of the fourth brazing material is located outside an outer periphery of the heat dissipating plate.

7. The circuit board according to claim 5,
wherein the lower surface of the metal circuit plate and the upper surface of the first insulating substrate are bonded together with a first brazing material interposed therebetween, and the upper surface of the heat diffusing plate and the lower surface of the first insulating substrate are bonded together with a second brazing material interposed therebetween,
wherein a thermal expansion coefficient of the first brazing material in at least an outer peripheral portion of the first brazing material is higher than a thermal expansion coefficient of the second brazing material, and wherein the first brazing material and the fourth brazing material have the same composition, and the outer peripheral portion of the first brazing material and the outer peripheral portion of the fourth brazing material are aligned with each other in a transparent plan view.

8. The circuit board according to claim 1, wherein an alloy layer containing a component of the heat diffusing plate and a component of a brazing material is disposed on a side surface of the heat diffusing plate.

9. The circuit board according to claim 1,
wherein the second insulating substrate is larger than the insulating substrate above the second insulating substrate in plain view, and
wherein the circuit board further comprises a cylindrical frame surrounding a side surface of the second insulating substrate.

10. The circuit board according to claim 1,
wherein the first insulating substrate comprises a through hole penetrating the first insulating substrate in a thickness direction, and
wherein the circuit board further comprises a through conductor disposed inside the through hole, electrically connected at one end to the metal circuit plate, and electrically connected at the other end to the heat diffusing plate.

11. The circuit board according to claim 1, wherein the metal circuit plate, the heat diffusing plate, and the heat dissipating plate are made of pure copper having a copper content more than or equal to 99.99 mass %.

12. The circuit board according to claim 1, wherein the insulating substrates are made of a silicon nitride based ceramic material.

13. An electronic device comprising:
the circuit board according to claim 1; and
an electronic component mounted on the metal circuit plate in the circuit board.

14. A circuit board comprising:
a metal circuit plate;
a plurality of metallic heat diffusing plates disposed below the metal circuit plate and arranged in an up-down direction;
a metallic heat dissipating plate below the plurality of heat diffusing plates;
a first insulating substrate disposed between the metal circuit plate and an uppermost heat diffusing plate of the plurality of heat diffusing plates and comprising an upper surface bonded to a lower surface of the metal circuit plate and a lower surface bonded to an upper surface of the uppermost heat diffusing plate;
a second insulating substrate disposed between a lowermost heat diffusing plate of the plurality of heat diffusing plates and the heat dissipating plate and comprising an upper surface bonded to a lower surface of the lowermost heat diffusing plate and a lower surface bonded to an upper surface of the heat dissipating plate; and
a third insulating substrate disposed between a pair of heat diffusing plates adjacent to each other in the up-down direction and comprising an upper surface bonded to a lower surface of an upper heat diffusing plate of the pair of heat diffusing plates and a lower surface bonded to an upper surface of a lower heat diffusing plate of the pair of heat diffusing plates,
wherein a grain diameter of metal grains contained in each of the heat diffusing plates decreases from each of the upper surface and the lower surface of the heat diffusing plate toward a center portion of the heat diffusing plate in a thickness direction.

15. The circuit board according to claim 14,
wherein the lower surface of the metal circuit plate and the upper surface of the first insulating substrate are bonded together with a first brazing material interposed therebetween, and the upper surface of the heat diffusing plate and the lower surface of the first insulating substrate are bonded together with a second brazing material interposed therebetween, and
wherein a thermal expansion coefficient of the first brazing material in at least an outer peripheral portion of the first brazing material is higher than a thermal expansion coefficient of the second brazing material.

16. The circuit board according to claim 14,
wherein the lower surface of the heat diffusing plate and the upper surface of the second insulating substrate are bonded together with a third brazing material interposed therebetween, and the upper surface of the heat dissipating plate and the lower surface of the second insulating substrate are bonded together with a fourth brazing material interposed therebetween, and
wherein a thermal expansion coefficient of the fourth brazing material in at least an outer peripheral portion of the fourth brazing material is higher than a thermal expansion coefficient of the third brazing material.

17. The circuit board according to claim 16,
wherein the lower surface of the metal circuit plate and the upper surface of the first insulating substrate are bonded together with a first brazing material interposed therebetween, and the upper surface of the heat diffusing plate and the lower surface of the first insulating substrate are bonded together with a second brazing material interposed therebetween,
wherein a thermal expansion coefficient of the first brazing material in at least an outer peripheral portion of the first brazing material is higher than a thermal expansion coefficient of the second brazing material, and
wherein the first brazing material and the fourth brazing material have the same composition, and the outer peripheral portion of the first brazing material and the outer peripheral portion of the fourth brazing material are aligned with each other in a transparent plan view.

18. The circuit board according to claim 14, wherein an alloy layer containing a component of the heat diffusing plate and a component of a brazing material is disposed on a side surface of the heat diffusing plate.

19. The circuit board according to claim 14,
wherein the first insulating substrate comprises a through hole penetrating the first insulating substrate in a thickness direction, and
wherein the circuit board further comprises a through conductor disposed inside the through hole, electrically connected at one end to the metal circuit plate, and electrically connected at the other end to the heat diffusing plate.

20. An electronic device comprising:
the circuit board according to claim 14; and
an electronic component mounted on the metal circuit plate in the circuit board.

* * * * *